US005680936A

United States Patent [19]
Beers

[11] Patent Number: 5,680,936
[45] Date of Patent: Oct. 28, 1997

[54] PRINTED CIRCUIT BOARD SORTING DEVICE

[75] Inventor: Gregory C. Beers, Hoover, Ala.

[73] Assignee: Automated Technologies Industries, Inc., Birmingham, Ala.

[21] Appl. No.: 404,299

[22] Filed: Mar. 14, 1995

[51] Int. Cl.$^6$ .................. B07C 5/00; B65G 37/00
[52] U.S. Cl. ............. 209/564; 209/571; 209/925; 198/346.2; 198/468.6
[58] Field of Search ................... 209/509, 552, 209/555, 559, 564, 571, 606, 651, 653, 916, 925; 198/346.1, 346.2, 468.6, 779, 790

[56] References Cited

U.S. PATENT DOCUMENTS

| | | | |
|---|---|---|---|
| 4,509,638 | 4/1985 | Kato et al. | 198/468.6 X |
| 4,682,695 | 7/1987 | Hasenbalg | 198/346.2 X |
| 4,742,905 | 5/1988 | Beers | 198/779 |
| 4,869,813 | 9/1989 | Bailey et al. | 209/564 X |
| 4,982,728 | 1/1991 | Masuda et al. | 198/346.2 X |
| 4,998,987 | 3/1991 | Jacobs | 209/552 |
| 5,310,039 | 5/1994 | Butera et al. | 198/346.2 |

FOREIGN PATENT DOCUMENTS

| | | | |
|---|---|---|---|
| 2124169 | 2/1984 | United Kingdom | 198/346.2 |

*Primary Examiner*—William E. Terrell
*Assistant Examiner*—Tuan Nguyen
*Attorney, Agent, or Firm*—Veal & Associates

[57] ABSTRACT

The present invention contemplates the use of a conveyor transporting circuit boards through a production line. At a point or stage in the production line where testing is to occur, the invention is employed to remove circuit boards from an input conveyor and transport them to a off line test assembly. Subsequent to testing, the invention is intended to selectively place the circuit boards on output conveyors in accordance with the results of testing, use an intelligent system, including a pick and place apparatus controlled to selectively retrieve boards from the input line and move them transversely to the line to a test site. The test site may include a staging conveyor for positioning the circuit boards received thereon on a bed-of-nails test station. Preferably, the pick and place apparatus will be able to move the boards to more than one test station, such that it may return to the input line and move another board while each board is being tested. Subsequent to testing, the pick and place apparatus retrieves the tested board from the test site and places it on one of a plurality of output conveyors in accordance with the results of testing. Multiple pick and place apparatuses and test sites may be advantageously configured along a single line within minimal floor space to achieve high rates of testing with minimal throughput delay.

3 Claims, 6 Drawing Sheets

PRINTED CIRCUIT BOARD SORTING DEVICE

FIELD OF THE INVENTION

The present invention relates generally to material handling devices for a manufacturing production line. In greater particularity, the present invention relates to the testing and sorting of individual planar units at a particular stage of a manufacturing production line. In even greater particularity, the invention relates to in-line production testing and sorting of printed circuit boards during manufacture.

BACKGROUND

Over the last twenty years, the consumer products industry has seen a revolution of technological innovation. The average consumer now demands extreme levels of flexibility and sophistication in the average consumer product, at competitive prices. Manufacturers have been forced to integrate products into smaller and smaller packages without loss of capability. Nowhere has this influence been more apparent than in the electronics industry. Many consumer electronics manufacturers have been forced to purchase highly automated, rapid manufacturing lines and when possible or economically feasible integrate 100% functional testing into the manufacturing process to remain competitive.

The advancements in the semiconductor industry have kept pace with consumer demands. The once ubiquitous unitized solid-state transistor, inductor, or capacitor component which was typically hand soldered onto a printed circuit board has been integrated into monolithic devices. Today, surface mounted integrated circuits are wave soldered onto multi-layered circuit boards as complex as their attached components.

Quality control has also dramatically changed. In the past, statistical testing at the end of a production line was a sufficient monitor of product quality. However, today's consumer expects and demands perfect quality and near perfect reliability. The potential reputation damage associated with a new product failing "out-of-the-box" has forced manufacturers to move toward 100% full functional testing of each item prior to consumer distribution.

Furthermore, zealous price competition is the norm for consumer products. Many manufacturers use fully automated production lines to assemble integrated circuits onto circuit boards, thus reducing cost and increasing manufacturing throughput. As a further cost cutting strategy, modern manufacturing lines incorporate functional testing at various stages of printed circuit board assembly so that early, low cost repair may be effectuated in the event of a board failure. Cost is also reduced by utilizing highly sophisticated manufacturing lines. Various types of conveyors are used in the lines to accommodate different types of printed circuit boards, several types of electronic sensors monitor board progress along production lines, and sequential stop singulators stop board movement along the line to regulate board movement. Additionally, many manufacturers have complex line operations which require board stacking, board buffering, and sophisticated system controls. However, cost savings from highly sophisticated manufacturing systems cannot be realized unless the production line's reliability matches its complexity.

One model of conveyor used in production lines is a free wheel type as shown in U.S. Pat. No. 4,742,905 (hereby incorporated by reference). A free wheel conveyor allows full line accumulation of boards due to the design of multiple free spinning support wheels. During manufacturing, unfinished boards rest upon multiple free spinning wheels. The production line continues to move but board movement is arrested with the use of production line sequential stop singulators. The singulator is an electromechanically or pneumatically actuated bar or pin. The singulator is usually positioned in the middle of the conveyor between tracks and is raised in front of a moving board to arrest the board's movement. The singulator is electrically controlled in response to electrical signals from a local sensor or a general line system controller.

Other types of conveyors are the belt conveyor and the chain conveyor. The belt conveyor usually consists of endless parallel anti-static belts on which a board rests. Unlike the free wheel conveyor, belt conveyors require sensors and a system controller to cooperatively move boards down a manufacturing line. Singulators add an additional safeguard to arrest board movement. The movement strategy of the chain conveyor is similar to the belt conveyor. A typical chain conveyor consists of parallel polyacetal chains that are greased and exhibit a low friction carrying surface.

Sensors for communicating board position to a system control unit or to a singulator come in three main styles. A through-beam sensor requires an emitter beam and collector array. An object passing through the beam closes (or opens) a circuit sending an electrical signal to a desired location. A retroflective sensor has an emitter, a receiver, and a reflector. Light interference from a production board triggers an electrical signal. Thirdly, a diffusion sensor parabolically emits an infrared beam in a prescribed pattern. The sensor's receiver will recognize any board movement within an inverted tear-drop shaped area in front of the emitter. All of these sensors may be integrated into a system control network for verifying board position.

Integration of sensors, singulators, and conveyors in a cooperatively smooth manufacturing line is critical to a low cost, high volume manufacturing operation. Manufacturing line reliability and throughput time are directly related to successful integration. To achieve this goal, typically a system controller in the form of a personal computer running a production control program or a dedicated programmable logic controller coordinates either a single manufacturing machine, conveying operation, testing operation, or all in coordinated conjunction.

As already stated, many printed circuit board assembly manufacturers are now integrating 100% full functional test into their manufacturing production lines. A typical in-line test has a bed-of-nails test fixture which is, in turn, connected to a standard industry tester. The test fixture is integrated into a special conveyor for testing engagement. As each board passes the test fixture, the board or fixture is moved so that the test fixture pins electrically engage with the board. The board is tested and if the test is successful the board typically continues down the line. If the board fails the test, typically an operator is notified to remove the board and place it on a nearby repair or reject conveyor.

In some cases the board will be automatically transferred off of the main production line onto a reject line by a "floor shuttle." A floor shuttle is a conveyor mounted on a shuttling device between two parallel conveyors. The floor shuttle conveyor occupies a section in both conveyors and moves from one conveyor to the other after receiving a tested board from an input conveyor. This strategy requires some way of tracking each board after the in-line bed of nails testing so that the shuttle knows where to deposit the incoming tested board. Digital controls or bar coding of each board could serve this tracking requirement. However, it should be noted that this testing procedure occurs serially, and the board may encounter other intermediate manufacturing operations prior to shuttling.

One disadvantage with this in-line test is that the speed of the manufacturing line and, hence, line throughput is directly related to the time it takes to run the test. Line throughput may be substantially reduced by an extended test. Multiple serial test fixtures can be used to test multiple boards at once (test pipelining), but this adds the additional expense of an additional tester for each test fixture. Adding additional testers is expensive relative to adding a section of a production line. Parallel production lines may be arranged so that a single tester may multiplex multiple lines; however, this method has the additional drawback of relegating conveyor rate to test time. Some redundant testing algorithms for complex products could significantly limit production line speed and thus, again, throughput. As stated above, a small degree of automation has occurred with the use of shuttles before and after the test fixture. However, the shuttle approach takes up extra space, requires difficult board tracking (knowing where the board is on the line at any given moment), and necessitates a complicated mechanical and electrical software interface. All of the stated in-line testing strategies do not provide an adequate and immediate means for sorting circuit boards. They lack in their ability to insure positive separation of pre-tested and post tested boards; they are slow; they limit the use of multiple testers and, therefore, take up valuable space.

Therefore, there exists a strong need in the printed circuit board assembly industry for a device that will allow in-line production testing utilizing multiple test fixtures for a single tester without significantly limiting production line speed, and automatically, immediately, and reliably sort boards in response to testing results.

SUMMARY OF THE INVENTION

It is the object of the invention to provide a materials handling device that will provide in-line production testing of planar units without substantially degrading manufacturing line throughput, and with resultant automatic sorting of the tested units.

It is another object of the invention to provide a materials handling device that will provide in-line production testing of printed circuit boards without substantially degrading manufacturing line throughput, and with resultant automatic sorting of the circuit boards.

Yet another object of the invention is to increase tester efficiency in an in-line production test by incorporating multiple test fixtures into a production line for a single tester.

Still another object of the invention is to provide a means to automatically move the printed circuit boards from a production assembly line with a pick and place gripper apparatus, move the circuit boards to a test fixture for testing, and move the circuit boards back to the conveying means after testing in response to the testing results so that the tested circuit boards are sorted (pass test or fail test).

At a point or stage in the production line where testing is to occur, the invention is employed to remove circuit boards from an input conveyor and transport them to an off-line test assembly. Subsequent to testing, the invention is intended to selectively place the circuit boards on output conveyors in accordance with the results of testing, e.g. failed boards on one output conveyor and good boards on another conveyor.

To accomplish this, we use an intelligent system, including a pick and place apparatus with a gripper which is controlled to selectively retrieve pre-tested boards from the input line and lift and move them transversely to the line to a test site. The test site may include a staging conveyor for positioning the circuit boards received thereon on a bed-of-nails test station. Preferably, the pick and place apparatus with a gripper will be able to move the pre-tested boards to more than one test station, such that it may return to the input line and move another board while each board is being tested. Subsequent to testing, the pick and place apparatus with a gripper retrieves the tested board from the test site and places it on a conveyor for boards that failed the test or on a conveyor for boards that passed the test. Multiple pick and place apparatuses with grippers may be advantageously configured along a single parallel line within a minimum of floor space to realize additional testing with a minimum increase in floor space and testers.

Other features, objects and advantages of the present invention will become apparent from a reading of the following description as well as a study of the appended drawings.

These and other objects and features of the invention are advantageously accomplished in the present invention by intercepting the circuit boards as they are processed such that the continuity of the overall process is not interrupted. That is to say, the present invention contemplates the use of a conveyor transporting circuit boards through a production line as on the conveyor line shown in U.S. Pat. No. 4,742, 905.

BRIEF DESCRIPTION OF THE DRAWINGS

Apparatus embodying features of my invention are depicted in the accompanying drawings which form a portion of this disclosure and wherein.

DESCRIPTION OF THE PREFERRED EMBODIMENT

Figure 1:
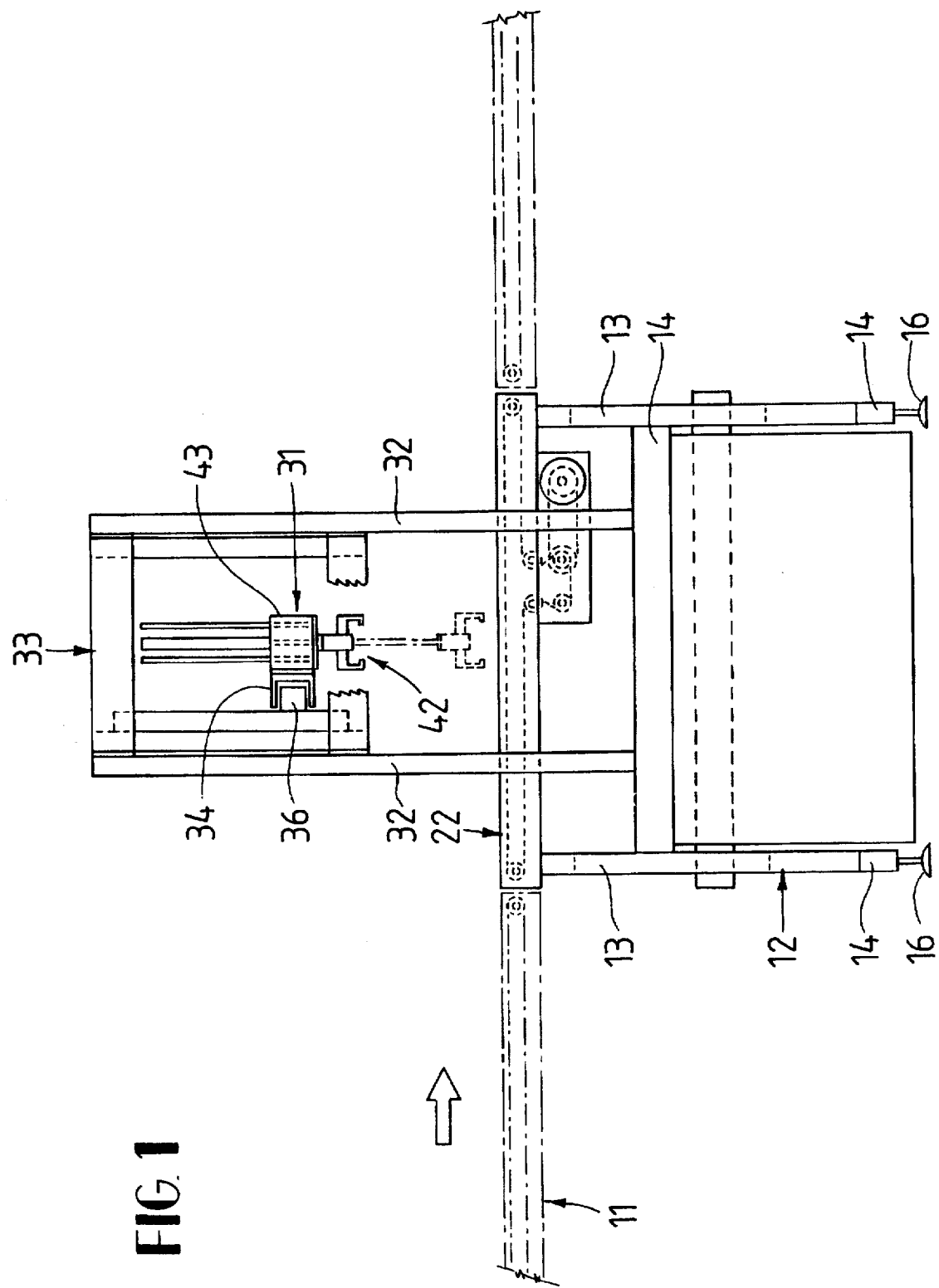
FIG. 1 a side elevational view of the invention positioned to receive circuit boards from a production line conveyor.

Referring to the drawings for a clearer understanding of the invention, it will be appreciated in FIG. 1 that circuit boards are transported along a production line conveyor 11, which may be any standard conveyor as described in U.S. Pat. No. 4,742,905. At any stage of production, it may be desirable to test the circuit board using commercially available testing apparatus which have a plurality of electrical input and output lines configured to interface with a circuit board via a "bed-of-nails" or other well known test station. Such testing apparatus are capable of outputting signals indicative of the results of the testing and are well known in the art. The specific function and level of output detail varies from device to device; however, each of the known devices may be configured such that the electrical output indicating the result of the test is usable as a control signal for subsequent manipulation of the board. That is to say, in the prior art, such outputs are used to identify the board for subsequent manual sorting and repair if needed. In the present invention, such outputs are usable to enable automated sorting. In the interest of clarity, I have depicted the tester generically in the drawings as at T, inasmuch as the specific details are not material to the invention.

As may be seen in FIGS. 1–5, the apparatus is mounted on a frame assembly 12 which includes a plurality of upright support members 13 and horizontal support members 14. Adjustable leveling feet 16 may be provided as needed to align the apparatus with conveyor 11. The frame assembly 12 includes provision for at least three parallel conveyors. One of these three conveyors is aligned with, or may be an extension of, conveyor 11 and is the input conveyor 21 for the invention. The other two conveyors, 22 and 23, are output conveyors. As may be seen in FIG. 3, the conveyors are preferentially of the type disclosed in U.S. Pat. No. 4,742,905; however, they may be of any type which can transposition individually delivered circuit boards 20 at a specified location along the run of the conveyor. That is to say, input conveyor 21 must have a drive mechanism which will allow it to be stopped and started to position the boards accurately, or it must be of the roller type that will allow the boards to be stopped accurately without stopping the conveyor. Thus, in using the conveyor of the '905 patent, my invention uses an extendable stop 24, also called a singulator, located at a selected position along the length of the conveyor, such that the boards carried by the conveyor may be stopped in exactly the same position repeatedly.

As shown in FIGS. 2–5, a pick and place apparatus 31 with a gripper is utilized in the depicted embodiment to move the circuit boards from the input conveyor 21 to the test fixture 50 and then to the output conveyors 22, 23. The pick and place apparatus 31 is supported on a plurality of vertically oriented frame extensions 32, which support a horizontally disposed transverse frame 33. Transverse frame 33 provides the support for the movable pick and place apparatus 31. It will be understood by those skilled in the art that the particular pick and place apparatus depicted herein is amenable to precise positioning along its travel, and may be a cartesian robot, a servo controlled mechanism, a precise positioning screw driven unit, or any of a number of devices which will accomplish the hereinafter described functions in an expeditious manner. Referring again to the figures, it may be seen that I have mounted a carriage head 34 on a rail 36, which has operably mounted therein an endless flexible drive belt 37 which is obscured from view but is commonly used in the art. The belt 37 is urged about its length by a servo motor 38, and serves to connect the pick and place carriage head to the servo motor such that the motor can precisely position the head 34 at any selected point along the length of rail 36. Necessary electrical and pneumatic connections to the carriage head 34 are accomplished by a travelling flexible connection and carrier as shown at 39. It is to be understood that the specific manner of connection of such sources of power are commonly employed; hence, detailed reference to such connection is not presented herein.

Figure 4:
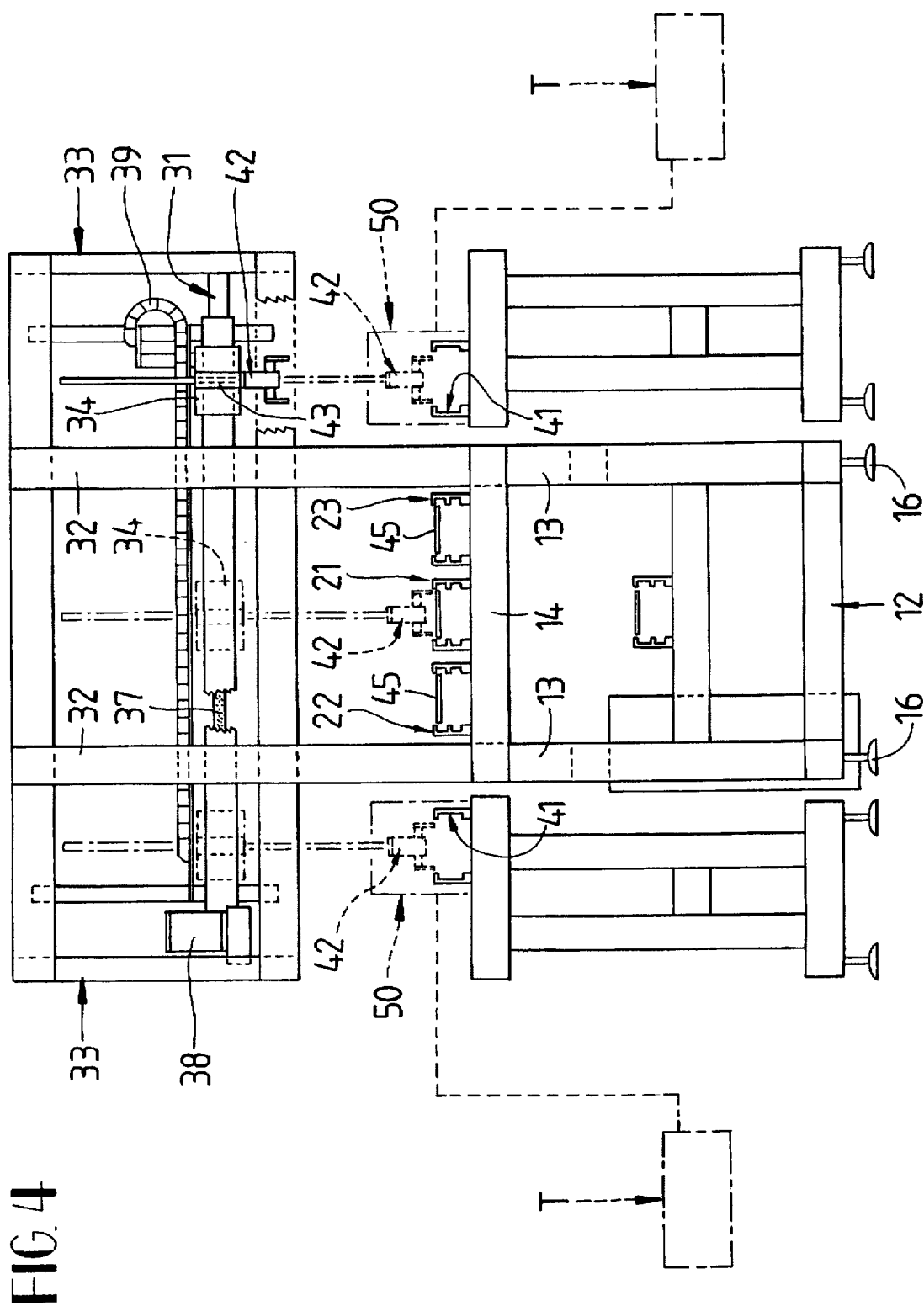
FIG. 4 is an end elevation of the invention as seen from the output end of the conveyors.
Figure 5:
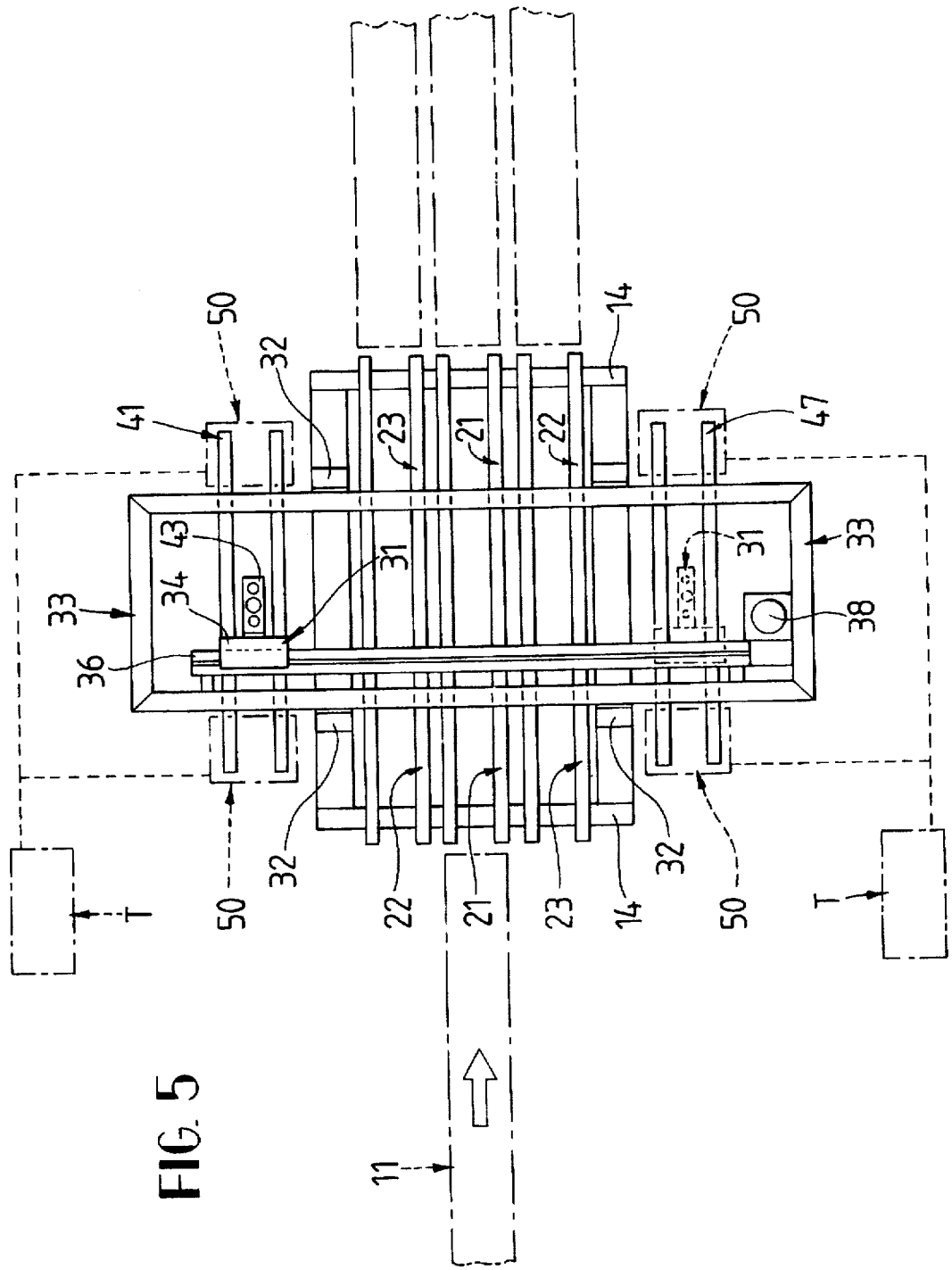
FIG. 5 is a plane view of the apparatus.

Referring to FIG. 4, it may be seen that the mounting of the pick and place apparatus is to position the carriage head selectively over the input and output conveyors and to permit the carriage head to move to a position over the test sites. In a preferred embodiment, the test sites are provided with conveyors 41, which are aligned parallel the input conveyor 21. Conveyors 41 serve the test fixtures 50 and have reversible drives such that a circuit board may be advanced along the conveyor into the test fixture and retracted to a position beneath the carriage head after testing, as will be more fully described hereinafter. The carriage head 34 carries a gripper assembly 42, mounted on a vertical linear slide 43. This linear slide can be easily manufactured or purchased from a linear slide manufacturer. The gripper assembly 42 is movable vertically such that it may also be positioned with some precision at a selected height. A cable carrier is provided to allow the gripper to be powered electrically or pneumatically, and to provide a signal path for any of a plurality of sensors which may be mounted to the gripper assembly.

It will be appreciated that the particular gripper assembly may vary depending on the size and sensitivity of the circuit board with which the device is being used. In the embodiment illustrated in FIG. 3, the board 20 may be mounted on a pallet 45 and the gripper assembly 42 actually engages the pallet rather than the board; however, the invention should not be so limited inasmuch as the conveyors used in the manufacture of the circuit boards may be capable of transporting the circuit boards without the necessity of such pallets, in which case the gripper assembly must be chosen to handle circuit boards directly. Additionally, printed circuit boards or pallets holding printed circuit boards can be lifted and transferred with pneumatic suction devices instead of a mechanical gripper.

Irrespective of the nature of the gripper, the position of the gripper and its fingers or pneumatic suction devices must be sensed for our apparatus to work properly. Accordingly, the gripper assembly 42 is provided with proximity sensors 46 which may be photocell or photoeye microswitches which utilize a light interruption or reflection to determine location, or reed switches or the like as is well known in the art. The proximity sensors should be able to generate signals which can be used to determine the height of the gripper assembly and whether the gripper fingers are open or closed. Additional sensors of the same or similar nature may be used to determine the position of the carriage head 34. Mounted adjacent the conveyors 21 and 41 are additional sensors 47 which can determine whether a circuit board is in a selected position relative to the sensor and, thus, relative to the transverse conveyor.

Figure 6:
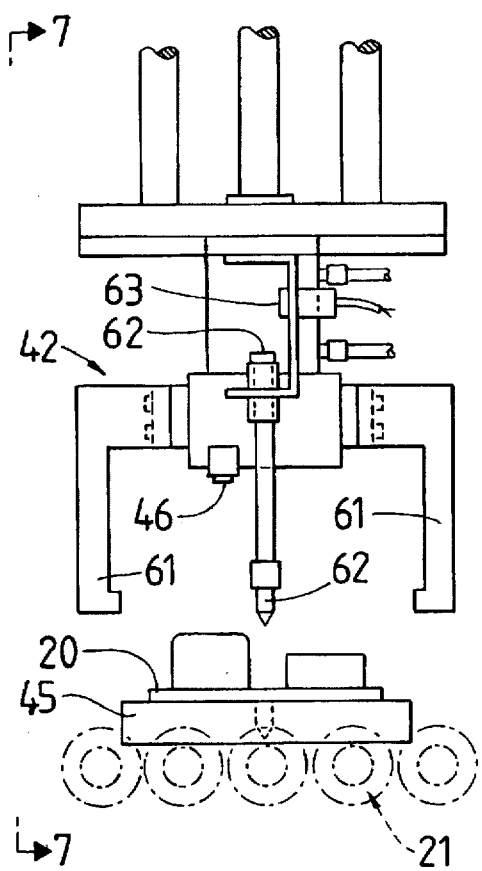
FIG. 6 is a side elevational view of the gripper mechanism used in the present invention.
Figure 7:
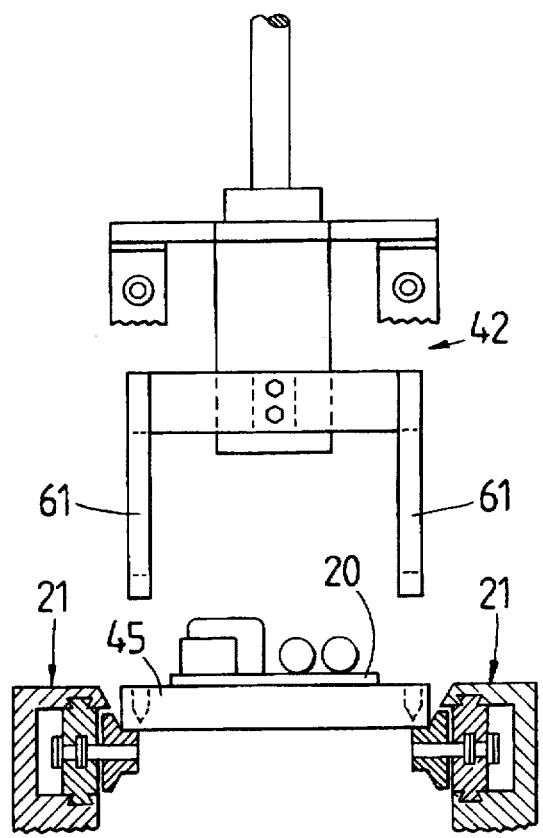
FIG. 7 is a view taken along line 7—7 of FIG. 6.
Figure 8:
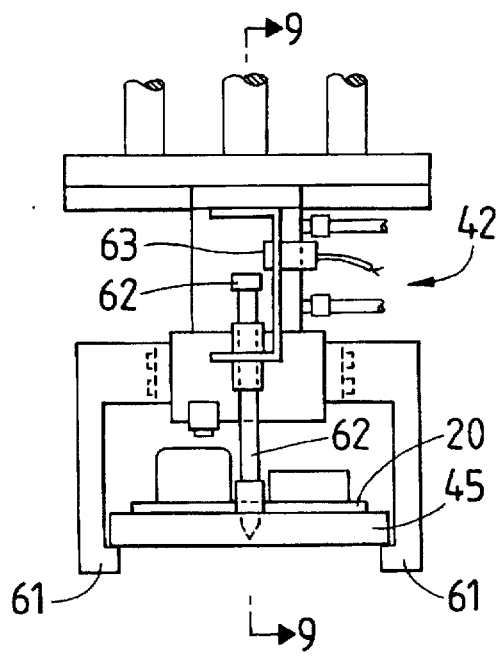
FIG. 8 is a side elevational view of the gripper engaging a board carrier.
Figure 9:
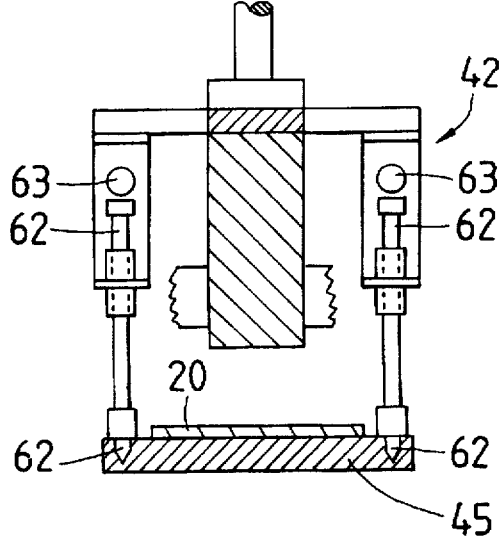
FIG. 9 is a sectional view taken along line 9—9 of FIG. 8.

At this point, a clearer understanding of the invention may be result from a description of the operation of the invention. Referring to FIG. 1, it may be seen that input conveyor 11 delivers circuit boards to the test area. These boards are received on the input conveyor 21 which, in FIGS. 2–5, is the center conveyor of the triple lane conveyor assembly. The actual arrangement of the conveyors is not critical because programming can change which conveyor is designated for pre-test, good test, and failed test. A singulator 24 positioned along the length of the conveyor 21 beneath the pick and place apparatus 31 is raised to present a stop for a board moving along the input conveyor. A sensor 47 detects the presence of the board adjacent the singulator and outputs a signal to a logic circuit or controller 51 which is programmed to integrate the movement of the conveyors, stops, and pick and place apparatuses. Sensors 47 adjacent conveyors 41 signal the controller whether the test positions are filled by previously delivered boards. If so, the board is allowed to continue along input conveyer 21 to a duplicate apparatus or may be held in position by the singulator until a test site becomes available. It may be seen that placing a series of the apparatus in combination will allow the input conveyor to deliver boards to several transfer conveyors for testing. If a space is available at a test site, controller 51 commands motor 38 to move the carriage head 34 along the rail to a position over the board. When the carriage is thusly positioned, as indicated to the controller 51 by a signal from the motor or from a proximity sensor which detects the head at the retrieval position above the input conveyor, the controller 51 sends a signal to lower the gripper assembly 42. As may be seen in FIGS. 6 and 7, the gripper assembly may be provided with fingers 61 to engage the pallet 45 or printed circuit board 20, a positioning pin 62 to assure proper alignment, and a proximity sensor 63 cooperatively positioned to determine the appropriate height. Pin 62 provides the sensed surface for sensor 63 such that as the grippers descend, as in FIGS. 8 and 9, the pin engages the pallet or printed circuit board and moves into cooperation, the sensor to generate a signal to the controller 51 to stop the downward movement of the gripper assembly. The gripper fingers are used to engage and lift the pallet or printed circuit board.

As the gripper assembly 42 lifts the board, the input conveyor 21 delivers another board to the retrieval position. Controller 51 signals the motor 38 to move the gripper to a position over the open test site. When the proper lateral movement has occurred, the controller 51 signals the apparatus and the gripper assembly is lowered to place the board on one of the test conveyors 41 or directly onto a test fixture 50. If the board is placed a test conveyor, the test conveyor may power the board over to an empty bed-of-nails type test fixture 50 or it may simply hold the board while testing is completed on another board. After releasing the board onto conveyor 41 the pick and place apparatus 31 is free to service the other conveyors. While the pick and place apparatus is servicing the other conveyors, conveyor 41 is responsive to the controller and moves forward and backward to deliver and retract the boards from one or both test fixtures 50. If a board is at the load position as delivered by the transfer conveyor and a board is in one or both of the test fixtures 50, the controller 51 does not move the conveyor 41 until testing is complete. Upon completion of the testing, the conveyor reverses moving the tested board to the load position. The transfer conveyor will return to the load position, based on signals received from the controller and from sensor 47. The gripper assembly 42 is used to retrieve the board from conveyor 41, transfer it to conveyors 22 or 23, and pick up another untested board from conveyor 21 and transfer it to conveyor 41.

A tester T may have many outputs and may have the capability to identify the specific problem with a board; however, for our purposes the tester merely needs to be connected to indicate to the controller 51 whether the board in a specific test fixture passed or failed. When the controller 51 is signaled that the board passed the test, it directs the pick and place apparatus such that the board is retrieved from conveyor 41 and carried to output conveyor 22, which is dedicated to "good" boards. Using the same type sensors, the pick and place apparatus moves the board from the tester conveyor to conveyor 22. The pick and place apparatus 31 is again free to service other conveyors as soon as the board is released to the "good" conveyor. Likewise, if the board is defective or "bad", it is delivered to output conveyor 23 which is dedicated to bad boards which require repair or disposal.

Accordingly, with reference to FIG. 4, it is readily understood that the pick and place apparatus 31 services five parallel conveyors, 21, 22, 23, 41 right and 41 left. At any given time, the system may have two boards in testing and two boards in test fixtures. By sensing where the boards are located and the results of the testing, the controller directs the pick and place apparatus 31 to move the boards from and input conveyor 21 to a testing conveyor 41, to an output conveyor 22 or 23. The device is limited only by the speed of a short conveying on conveyor 41 inasmuch as soon as a board is removed from the tester conveyor 41 that conveyor can deliver a waiting board to the tester, while the last tested board is moved to an output conveyor. If two beds-of-nails test fixtures are allocated to a tester, that tester will always be testing a board. Where one test sequence finishes, the second test sequence for a second board immediately begins. During testing, an untested board will replace the tested board in the open test fixture.

Figure 2:
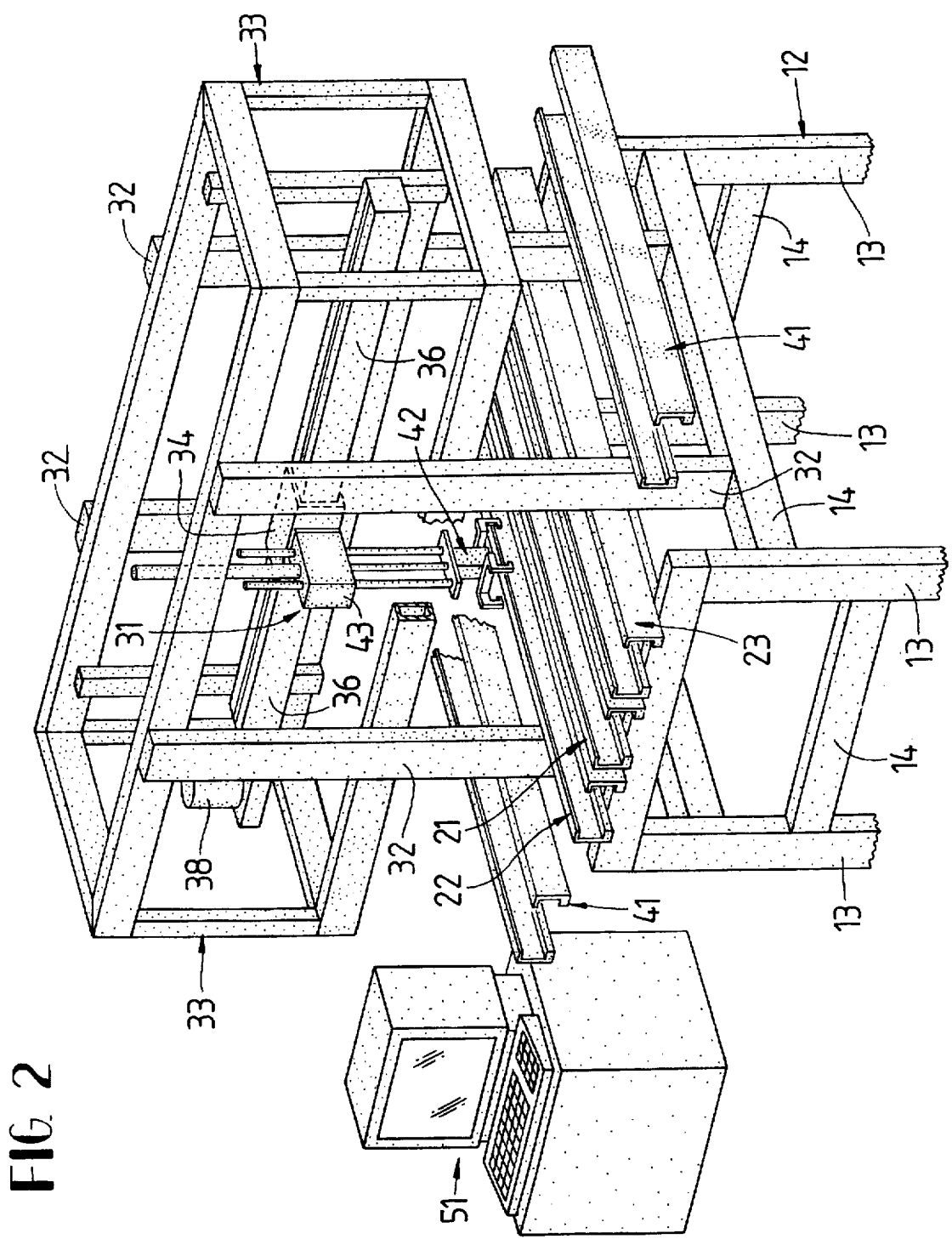
FIG. 2 is a perspective view of the invention.
Figure 3:
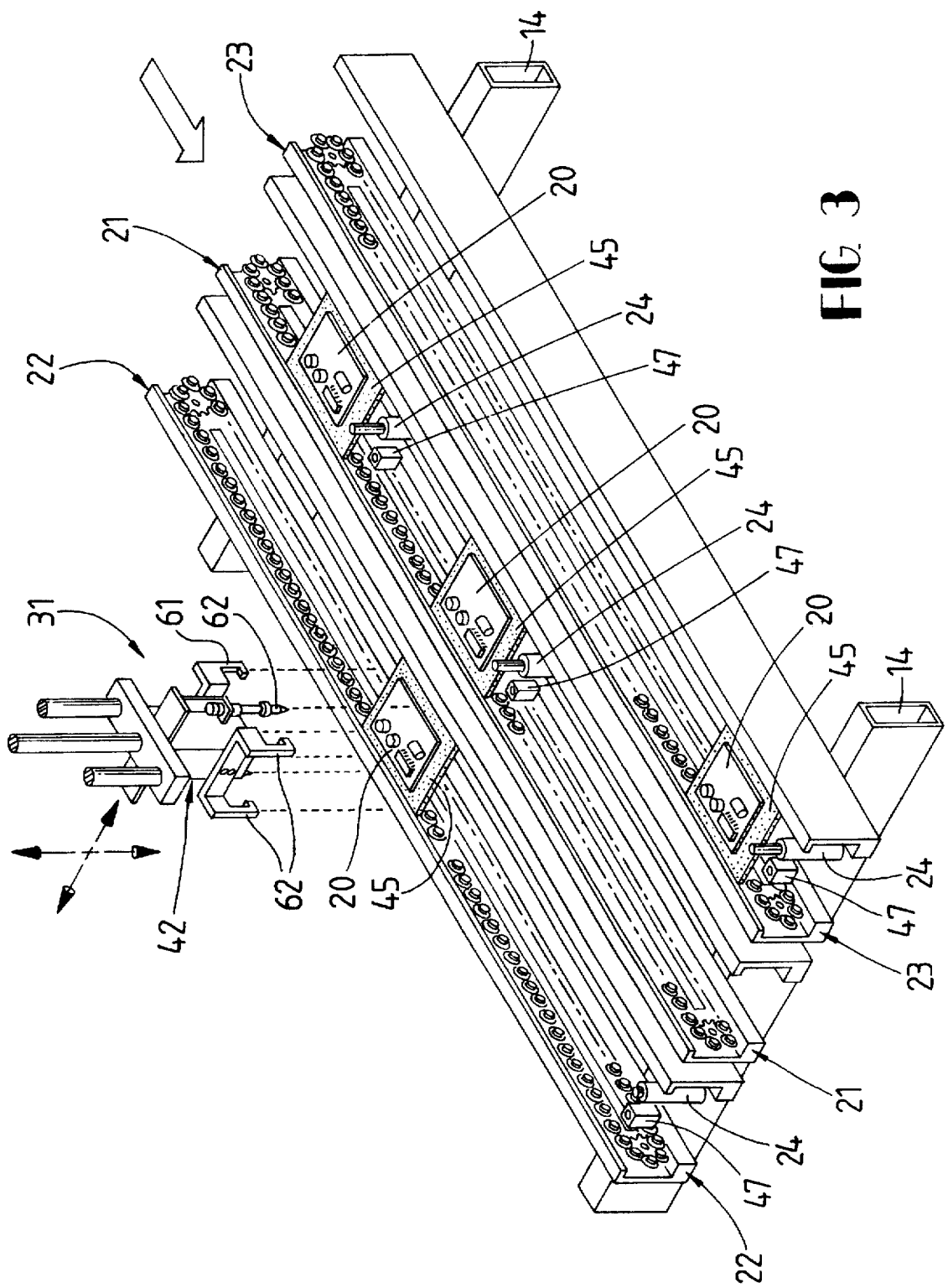
FIG. 3 is a partial perspective view showing the details of the input and output conveyors.

It will be appreciated that the controller 51 may be a personal computer or a logic bridge and may have the capability of generating a display for a human operator and an input device such as an alphanumeric keyboard for receiving commands from an operator. Such an operator station is shown in FIG. 2.

While I have shown my invention in one form, it will be obvious to those skilled in the art that it is not so limited but is susceptible of various changes and modifications without departing from the spirit thereof.

What is claimed is:

1. A material handling device for moving and sorting planar units at a selected point on a production line for said units, comprising:

a) conveying means for conveying said planar units located at said selected point;

b) sorting means for removing each of said planar units from said conveying means to one of a plurality of test positions for testing, for receiving test results, and for replacing said tested planar units onto said conveying means in accordance with said test results such that 100% testing of said units occurs at said selected point on said production line;

c) frame means for securing said conveying means to said sorting means; and, d) wherein said conveying means comprises at least one input conveyor for receiving said planar units from said production line and moving said units to said sorting means; and, at least one output conveyor for dispensing said sorted units from said sorting means; and wherein said sorting means comprises first testing means for testing a first selected portion of said planar units carried by said input conveyor; second testing means for testing any remaining planar units carried by said input conveyor; pick and place means for moving said first selected portion of said planar units from said input conveyor to said first testing means for testing and for dispensing said first selected portion of said planar units to said output conveyor after testing, and for moving said remaining portion of said planar units from said input conveyor to said second testing means for testing and for dispensing said remaining portion of said planar units to said output conveyor after testing by said second testing means; said first testing means including a test fixture and second conveying means for conveying said first selected units, said second conveying means having a first end and a second end, wherein said test fixture is mounted on said first end and said second end is positioned for receiving said first selected portion of said planar units from said pick and place means, conveying said units to said test fixture for testing, and for conveying said tested units back to said second end for dispensing to said output conveyor by said pick and place means; and, said second testing means including a second test fixture and third conveying means for conveying said remaining portion of said planar units, said third conveying means having a first end and a second end, wherein said second test fixture is mounted on said first end and said second end is positioned for receiving said remaining portion of said planar units from said pick and place means, conveying said units to said test fixture for testing, and for conveying said tested units back to said second end for dispensing to said output conveyor by said pick and place means.

2. A method for moving and sorting planar units at a selected point on a production line for said units, comprising the steps of:

a) receiving said planar units from said production line at said selected point onto a first conveying means;

b) conveying said planar units to a first pick and place means for moving first selected units to a second conveying means;

c) placing said first selected units onto said second conveying means;

d) conveying the remainder of planar units to a second pick and place means for movement to a third conveying means;

e) placing said remainder units onto said third conveying means;

f) conveying said first selected planar units on said second conveying means to a testing device associated with said second conveying means;

g) concurrently with conveying said first selected planar units on said second conveying means to said testing device, conveying said remainder planar units on said third conveying means to a second testing device associated with said third conveying means;

h) concurrently testing said selected planar units and said remainder planar units;

i) concurrently conveying said tested first selected units and said tested remainder units away from said testing devices; and, j) selectively depositing said tested first selected and remainder planar units onto said first conveying means with said first and said second pick and place means responsive to said test results for dispensing in accordance with said test results.

3. A material handling device for moving and sorting planar units at a selected point on a production line for said units, comprising:

a) conveying means for conveying said planar units located at said selected point;

b) sorting means for removing each of said planar units from said conveying means to one of a plurality of test positions for testing, for receiving test results, and for replacing said tested planar units onto said conveying means in accordance with said test results such that 100% testing of said units occurs at said selected point on said production line;

c) frame means for securing said conveying means to said sorting means; and, d) wherein said conveying means comprises at least one input conveyor for receiving said planar units from said production line and moving said units to said sorting means; and, a plurality of output conveyors for dispensing said sorted units from said sorting means; and wherein said sorting means comprises first testing means for testing a first selected portion of said planar units on said input conveyor; second testing means for testing the remainder of said planar units on said input conveyor; first pick and place means for moving said first selected portion of said planar units from said input conveyor to said first testing means for testing and for dispensing said first selected portion of said planar units to said output conveyors after testing; second pick and place means for moving said remainder of said planar units from said input conveyor to said second testing means for testing and for dispensing said tested remainder of said planar units to said output conveyors after testing; said first testing means including a test fixture and second conveying means for conveying said first selected units for testing, said second conveying means having a first end and a second end, wherein said test fixture is mounted on said first end and said second end is positioned for receiving said first selected portion of said planar units from said first pick and place means, conveying said units to said test fixture for testing, and for conveying said tested units back to said second end for dispensing to said output conveyors by said first pick and place means; and, said second testing means including a second test fixture and third conveying means for conveying said remaining portion of said planar units for testing, said third conveying means having a first end and a second end, wherein said second test fixture is mounted on said first end and said second end is positioned for receiving said remainder of said planar units from said second pick and place means, conveying said units to said second test fixture for testing, and for conveying said tested units back to said second end for dispensing to said output conveyors by said second pick and place means.

* * * * *